(12) United States Patent
Codutti et al.

(10) Patent No.: US 9,433,048 B2
(45) Date of Patent: Aug. 30, 2016

(54) METHOD FOR CONTROLLING A MOTOR VEHICLE LIGHTING DEVICE THAT USES LEDS

(71) Applicant: AUTOMOTIVE LIGHTING ITALIA S.p.A., Venaria Reale (IT)

(72) Inventors: Giancarlo Codutti, Tolmezzo (IT); Davide Baccarin, Tolmezzo (IT); Alberto Guiotto, Tolmezzo (IT); Jasmin Kreso, Tolmezzo (IT)

(73) Assignee: Automotive Lighting Italia S.p.A., Venarla Reale (IT)

( * ) Notice: Subject to any disclaimer, the term of this patent is extended or adjusted under 35 U.S.C. 154(b) by 0 days.

(21) Appl. No.: 14/921,508

(22) Filed: Oct. 23, 2015

(65) Prior Publication Data

US 2016/0119989 A1 Apr. 28, 2016

(30) Foreign Application Priority Data

Oct. 24, 2014 (IT) .............................. TO2014A0870

(51) Int. Cl.
*B60Q 1/14* (2006.01)
*H05B 33/08* (2006.01)
*B60Q 1/00* (2006.01)

(52) U.S. Cl.
CPC ......... *H05B 33/0827* (2013.01); *B60Q 1/0076* (2013.01); *H05B 33/0845* (2013.01)

(58) Field of Classification Search
None
See application file for complete search history.

(56) References Cited

U.S. PATENT DOCUMENTS

| 7,948,468 | B2 * | 5/2011 | Zane | G09G 3/342 345/102 |
| 2005/0212459 | A1 * | 9/2005 | Patel | H05B 33/0815 315/291 |
| 2009/0195182 | A1 | 8/2009 | Ezaki | |
| 2010/0001944 | A1 | 1/2010 | Seong et al. | |
| 2011/0267375 | A1 * | 11/2011 | Yang | G09G 3/3406 345/690 |
| 2012/0098869 | A1 | 4/2012 | Tseng | |
| 2013/0069553 | A1 | 3/2013 | Lin et al. | |

FOREIGN PATENT DOCUMENTS

DE 102008027148 12/2009

OTHER PUBLICATIONS

Westlund, Introduction 2 Set up 3 Adding Randomness Random Number Generation Using the MSP430, pp. 1-3, Oct. 13, 2006; http://www.ti.com/lit/an/slaa338/slaa338.pdf.
Italian Search Report and Written Opinion for Italian Application No. IT TO2014000870 dated Apr. 13, 2015.

* cited by examiner

*Primary Examiner* — Douglas W Owens
*Assistant Examiner* — James H Cho
(74) *Attorney, Agent, or Firm* — McCarter & English, LLP

(57) ABSTRACT

A method for controlling a motor-vehicle lighting device is provided that uses LEDs supplied with PWM signals temporally spaced apart from one another by a first time phase t1 and a second time phase t2. An interval of interest is defined in which an electromagnetic disturbance must not exceed a maximum threshold value θmax; driving signals are supplied on the basis of first phases t1 and t2 computed; and the measured or simulated waveform of the electromagnetic disturbance deriving from the phases t1 and t2 is compared with the maximum threshold value within the interval of interest defined. Where the waveform of the disturbance exceeds the threshold, two phases t1 and t2, once again different from one another, are recalculated; otherwise, the last phases t1 and t2 calculated are selected and used in the PWM control. An advantageous motor-vehicle lighting device is also provided.

10 Claims, 3 Drawing Sheets

METHOD FOR CONTROLLING A MOTOR VEHICLE LIGHTING DEVICE THAT USES LEDS

TECHNICAL FIELD

The present invention relates to a method for controlling a motor-vehicle lighting device that uses LEDs (Light-Emitting Diodes) and a motor vehicle lighting device based thereon.

BACKGROUND OF THE INVENTION

As is known, LEDs find increasing application in the automotive field on account of the intrinsic advantages associated to use thereof, such as, for example: reduced power consumption, contained weight, limited overall dimensions, high reliability, average service life longer than that of normal lamps, attractive design, low thermal emission, and possibility of modulating the light intensity emitted by the LEDs.

As regards this latter aspect, it is known to carry out control of brightness of LEDs by supplying thereto a current having a rectangular waveform and adjusting the time width (duration) of the rectangular pulses by means of a PWM (Pulse-Width Modulation) control. Use of a PWM control enables operation of the LEDs in an operating area in which the duration is maximized and the thermal emission is further reduced.

For example, the patent application DE 10 2008 027 148 filed in the name of TechnisSat Digital GmbH describes a vehicle lighting device, in particular a rear brake light, in which at least three sets of LEDs belonging to respective circuit branches are supplied through switches switched by means of respective first, second, and third driving signals having a rectangular waveform and constant frequency. Each waveform is phase-offset with respect to the other waveforms in such a way that, globally, the various LEDs are lit up in time intervals that are substantially contiguous (the falling edge of one rectangular pulse coincides with or is close to the rising edge of a rectangular pulse of another waveform—see FIG. 4 of the patent application DE 10 2008 027 148) in order to provide a "practically continuous" lighting effect that improves the perception by the human eye of the light produced by the lighting device.

The phase offset of the various waveforms with respect to one another is obtained by applying a phase difference that is an integer multiple N·Tf of a common phase difference Tf between the various waveforms. In this way, the current It globally supplied to the various sets of diodes is given by the following expression:

$$It = i(t) + i(t-Tf) + i(t-2Tf), \ldots, i(t-NTf)$$

where $i(t)+i(t-Tf)+i(t-2Tf), \ldots, i(t-NTf)$ are the pulsating currents supplied to each branch. The terms $i(t)$, $i(t-Tf)$, $i(t-2Tf), \ldots, i(t-NTf)$ have a rectangular waveform.

In other words, the temporal spacing between one waveform and the next is constant (Tf).

The current globally supplied to the LEDs is variable in time, and the frequency spectrum of said current is other than zero for frequencies higher than zero.

In order to compute the frequency spectrum, it is necessary to compute the Fourier transform of the function $i(t)$, recalling that the Fourier transform of the boxcar function is the sin c(f) function.

Since the signal is periodic, its spectrum N'(f) is given by the sum of sin c(f) functions for the various boxcar functions and a phase given by the sum of the phases $e^{-j2\pi fti}$ (or phasors), i.e.

$$N'(f) = \sum_{i=0}^{2} sinc(f) \cdot e^{-j2\pi fti}$$

By extracting the real part from the summation, we obtain:

$$N'(f) = sinc(f) \cdot \sum_{i=0}^{2} e^{-j2\pi fti}$$

The presence of a non-zero frequency spectrum inevitably entails generation of a disturbance that may be transmitted in a conducted or radiated way and that may be potentially dangerous in so far as it interferes with other electronic devices provided on the vehicle. In particular, in the case of the patent illustrated above, it may be shown mathematically how the phasors add up; for this reason, the absolute value of the summation of the phasors $$\left| \sum_{i=0}^{2} e^{-j2\pi fti} \right|$$

is equal to the number of branches.

The time spacing between the driving signals and the waveforms envisaged according to the known art (patent application DE 10 2008 027 148) consequently represents the spacing that concurs in maximizing electromagnetic disturbance.

SUMMARY OF THE INVENTION

The aim of the present invention is to provide a method for controlling a motor-vehicle lighting device in which different sets of LEDs are supplied with PWM techniques where the electromagnetic emissions are minimized as compared to the known art.

The above aim is achieved by the present invention according to a method for controlling a motor-vehicle lighting device comprising: a first set of LEDs that form a first branch of a circuit provided with at least one first electronic switch that can be activated by being closed to power the LEDs of the first branch; a second set of LEDs that form a second branch of a circuit provided with at least one second electronic switch that can be activated by being closed to power the LEDs of the second branch; and a third set of LEDs that provides a third branch of a circuit provided with at least one third electronic switch that can be activated by being closed to power the LEDs of the third branch. The disclosed method includes the steps of: computing a first time phase t1 and a second time phase t2 different from one another; defining limits in frequency of an interval of interest in which a radiated or conducted electromagnetic disturbance produced by said lighting device must not exceed a maximum threshold value θmax; supplying to each first, second, and third electronic switch a respective first, second, and third driving signal having a rectangular waveform, a constant frequency, and a duration that can be adjusted according to a PWM control in order to control the current supplied to each set of LEDs and the brightness of the LEDs themselves, the second driving signal being spaced apart from the first driving signal by the time phase t1, and the third driving signal being spaced apart from the second driving signal by the time phase t2; comparing the measured or simulated waveform of the electromagnetic disturbance deriving from the phases t1 and t2 with the maximum threshold value within the interval of interest defined; in the case where the waveform of the disturbance exceeds the threshold recalculating two phases t1 and t2, once again different from one another; otherwise, selecting the last phases t1 and t2 calculated and using them in the PWM control.

Preferably, the step of computing a first phase t1 and a second phase t2 comprises the steps of: generating a first pair of random numbers N1, N2 ranging between zero and one; computing the first phase t1 as Tb·N1 and the second phase t2 as Tb·N2 on the basis of the first pair of random numbers in such a way that the phases are different from one another, Tb representing a base period.

Preferably, the following steps are envisaged: detecting the frequency f° of the clock associated to a microcontroller of the driving device; and computing the base period Tb as $1/f°$.

Additional features, functions and benefits of the present invention will be apparent from the detailed description which follows, particularly when read in conjunction with the accompanying figures.

BRIEF DESCRIPTION OF THE DRAWINGS

The invention will now be illustrated with particular reference to the attached drawings, which illustrate a preferred non-limiting embodiment thereof and in which.

DETAILED DESCRIPTION OF THE INVENTION

Figure 1:
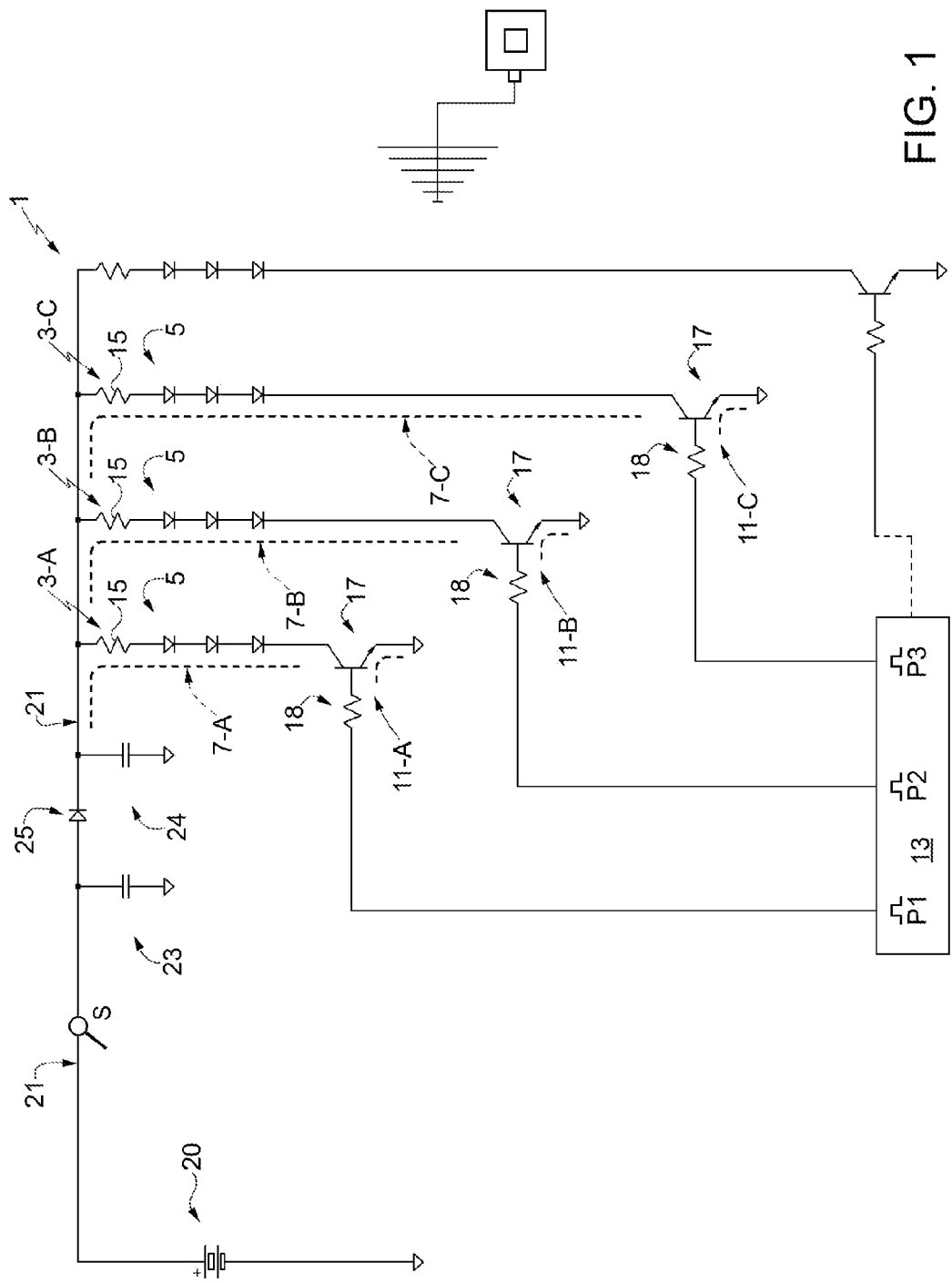
FIG. 1 is a schematic illustration of a motor-vehicle lighting device obtained according to the teachings of the present invention.

Designated as a whole by 1 in FIG. 1 is an electrical circuit of a motor-vehicle lighting device, in particular a front light, a back light, or else an indicator such as a direction indicator, a brake light, etc.

The lighting device comprises:
a first set 3-A of LEDs 5 that form a first branch 7-A of a circuit provided with at least one first electronic switch 11-A that can be activated by being closed to power the LEDs 5 of the first branch 7-A;
a second set 3-B of LEDs 5 that form a second branch 7-B of a circuit provided with at least one second electronic switch 11-B that can be activated by being closed to power the LEDs 5 of the second branch 7-B;
a third set 3-C of LEDs 5 that form a third branch 7-C of a circuit provided with at least one third electronic switch 11-C that can be activated by being closed to power the LEDs 5 of the third branch 7-C;
a driving device 13 designed to supply to each first, second, and third electronic switch 11-A, 11-B, 11-C a respective first, second, and third driving signal having a rectangular waveform, a constant frequency, and a duration that can be adjusted according to a PWM control in order to control the current supplied to each set of LEDs and the brightness of the LEDs themselves.

Of course, the number of branches may differ from what has been represented above (FIG. 1 shows a branch without numbers to indicate the possible presence of other branches). Typically, the LEDs belonging to each branch perform a specific function in the lighting device.

In the example represented, the LEDs 5 are set in series with respect to one another along each branch 7. The example illustrates three LEDs in series with respect to one another, but the number may be any. Moreover, the LEDs may be arranged according to different topologies, for example in parallel with respect to one another, or else sets of LEDs in parallel set in series with respect to one another.

A resistor 15 is set along each branch and has a value of resistance configured for limiting the current that flows within the diodes, for example 150Ω, to a maximum value. Each branch is sized, as regards the number of the LEDs 5 and of resistors 15, in such a way as to present the same impedance as that presented by the other branches in such a way that the current is equally divided between the various branches (i.e., each branch absorbs substantially the same current).

In the example of embodiment represented, the electronic switch is provided by an NPN bipolar transistor 17 having its emitter connected to ground, its collector connected to the cathode of the last diode 5 of the series, and its base that receives the driving signal varying in voltage through a resistor 18. The bipolar transistor 17, which operates in saturation, is driven into the closing condition when the driving signal has a first logic value (1) and remains open when the driving signal has a second logic value (0).

The device 1 is supplied by a voltage source 20 (typically, the motor-vehicle battery) having a negative terminal connected to ground and a positive terminal connected to a first terminal of the resistors 15 through an electrical line 21. The resistors 15 have a second terminal connected to an anode of a first diode 5 of the series.

A pair of electrolytic capacitors 23, 24 have a first terminal connected to ground and a second terminal connected to the line 21. Set between the second terminals of the capacitors 23 and 24 is a diode 25 with the cathode facing the sets of diodes 5. The capacitors 23 and 24 and the diode 25 provide a circuit designed to stabilize the voltage supplied to the diodes 5 by the battery 20 (as is known, the voltage supplied by the battery of a motor vehicle presents considerable fluctuations).

Figure 2:
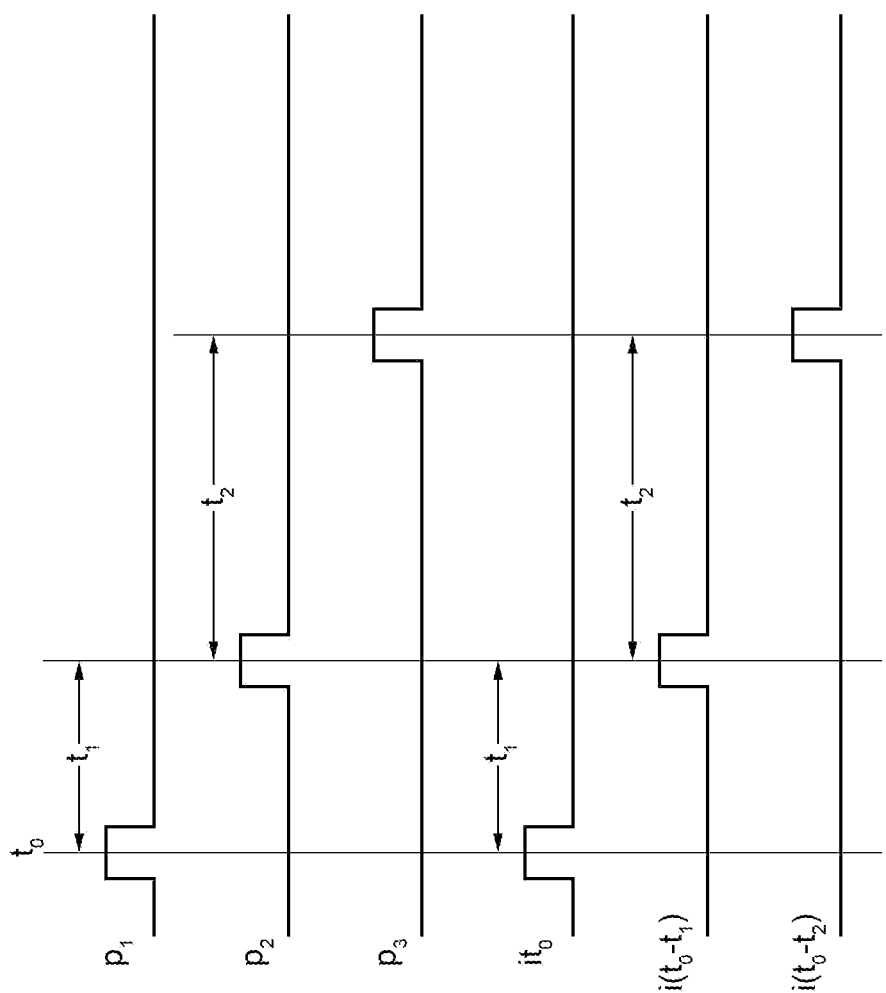
FIG. 2 shows a pair of driving signals of the lighting device of FIG. 1.

The driving device 13 according to the present invention performs spacing of the second driving signal p2 with respect to the first driving signal p1 (FIG. 2) by a time phase t1.

The third driving signal p3 is spaced apart from the second driving signal p2 by a time phase t2. The phases t1 and t2 are different from one another and are defined iteratively with the modalities that will be clarified hereinafter.

The waveform of the current i(t0−t1) that flows in the second branch is spaced apart by an interval t1 with respect to the waveform i(t0) that flows in the first branch, and the waveform of the current i(t0−t2) that flows in the third branch is spaced apart by an interval t2 with respect to the waveform i(t0−t1) that flows in the second branch. It may be shown, by computing the Fourier transform of the overall current supplied to the three branches (i(t0)+i(t0−t1)+i(t0− t2)), that the modulus of the phasors of the transform is normally (i.e., for a large number of frequencies) lower than the number of the branches (three, in the example).

The above condition is satisfied for any number of branches in which the time spacing between each driving signal and that of the branch that is supplied next is a number that changes for each pair of branches taken into consideration.

According to the present invention, the driving device 13 is designed to generate the phases t1 and t2 by performing the following operations:

A. detecting the frequency f° of the clock associated to a microcontroller of the driving device 13 (for example, f°=4 MHz);

B. computing a base period Tb as 1/f° (for example $1/4 \cdot 10^6 = 0.25$ μs);

C. generating a first pair of random numbers N1, N2 ranging between zero and one with a known methodology (for example, using Matlab™ or a similar computing application);

D. computing a first value of the first phase t1 as Tb·N1 and the second phase t2 as Tb·N2 on the basis of the first pair of random numbers;

E. defining limits in frequency of an interval of interest (for example, 100-300 kHz) in which the electromagnetic disturbance must not exceed a maximum threshold value θmax (for example, 70 dBμV);

F. comparing the (measured/simulated) waveform of the electromagnetic disturbance deriving from the phases tb·N1 and Tb·N2 with the maximum threshold value within of the interval of interest defined;

G. in the case where the waveform of the disturbance exceeds the threshold, repeating steps c) and d); otherwise, selecting the pair of numbers N1 and N2 defined in step c) and using them for the final definition of the phases t1 and t2; conveniently, storing the final value t1 and t2 in a memory so that it can then be used continually.

Obviously, in the case where N branches are present, N−1 random numbers are generated to compute the N−1 phases t1, t2, t3, . . . , ti, . . . , tN−1.

Of course, the different phases t1 and t2 could be obtained with different technologies such as by using counters, logic networks, etc.

Figure 3:
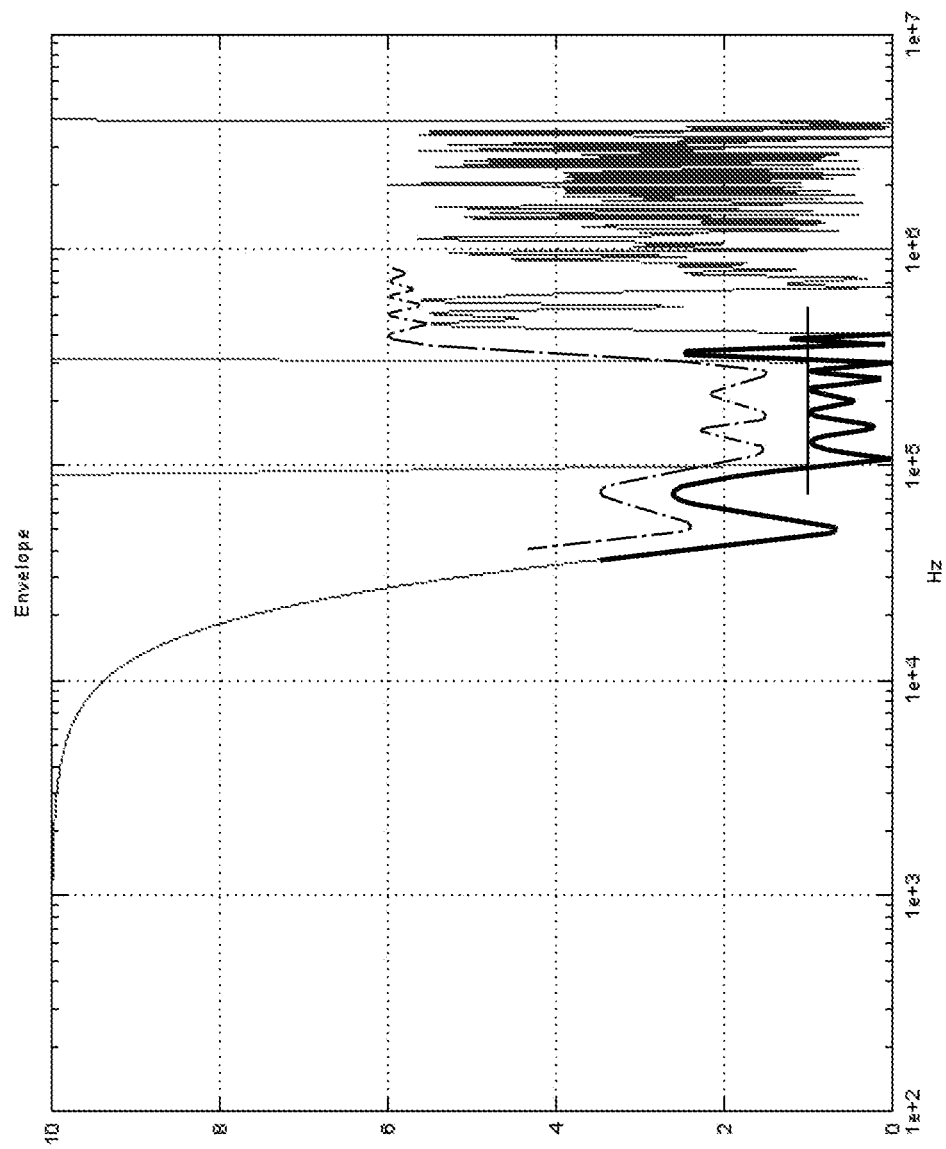
FIG. 3 shows a diagram that exemplifies the intensity of the electromagnetic field produced by the device according to the present invention.

The theoretical studies and tests conducted by the present applicant have shown how the iterative method described above enables generation of phases that globally concur in definition of phasors that cancel out partially over a wide frequency spectrum, enabling, on a global level, reduction of electromagnetic disturbance in the region of 10-20 dB at the frequency of interest (see FIG. 3, which represents with the dashed line the value of disturbance for a first pair t1, t2 and with the solid line the value of disturbance for a pair t1, t2 obtained after a certain number of iterations, for example, 160).

The iterative procedure highlighted above makes it in fact possible to extract the set of random numbers that best concurs in the reduction of electromagnetic noise in the frequency window defined.

For example, the maximum threshold value θmax may be fixed at 33 dBμV for an interval of interest ranging from 150 kHz to 120 MHz. According to another example, the maximum threshold value θmax is fixed at 20 dBμV for an interval of interest ranging from 150 kHz to 6 GHz.

As regards the measurement of the electromagnetic disturbance, this can be carried out using a probe S (FIG. 1) connected to the power-supply line 21 in order to determine the conducted electromagnetic disturbance. Alternatively, the disturbance can be detected by setting an antenna A (FIG. 1) at a pre-set distance from the electronic circuit 1 and using a field meter to determine the radiated disturbance.

Thanks to the operations illustrated above, it is possible to reduce markedly the electromagnetic emission typically by at least 20 dB.

The present invention has been described with reference to exemplary embodiment(s) and implementation(s) thereof. However, as will be readily apparent to persons skilled in the art, the present invention is not limited by or to such exemplary embodiment(s) and implementation(s).

The invention claimed is:

1. A method for controlling a motor-vehicle lighting device comprising:
    a first set (3-A) of LEDs (5) that form a first branch (7-A) of a circuit provided with at least one first electronic switch (11-A) that can be activated by being closed to power the LEDs of the first branch (7-A);
    a second set of LEDs (3-B) that form a second branch (7-B) of a circuit provided with at least one second electronic switch (11-B) that can be activated by being closed to power the LEDs of the second branch (7-B); and
    a third set of LEDs (3-C) that form a third branch (7-C) of a circuit provided with at least one third electronic switch (11-C) that can be activated by being closed to power the LEDs of the third branch (7-C);
    the method comprising the steps of:
        computing a first time phase t1 and a second time phase t2 different from one another;
        defining limits in frequency of an interval of interest in which a radiated or conducted electromagnetic disturbance produced by said lighting device must not exceed a maximum threshold value θmax;
        supplying to each first, second, and third electronic switch a respective first, second, and third driving signal having a rectangular waveform, a constant frequency, and a duration that can be adjusted according to a PWM control in order to control the current supplied to each set of LEDs and the brightness of the LEDs themselves, the second driving signal being spaced apart from the first driving signal by the time phase t1, and the third driving signal being spaced apart from the second driving signal by the time phase t2;
        comparing the measured or simulated waveform of the electromagnetic disturbance deriving from the phases t1 and t2 with the maximum threshold value within the interval of interest defined; and
        in the case where the waveform of the disturbance exceeds the threshold, recalculating two phases t1 and t2 once again different from one another; otherwise, selecting the last phases t1 and t2 calculated and using them in the PWM control.

2. The method according to claim 1, wherein the step of computing a first phase t1 and a second phase t2 comprises the steps of:
    generating a first pair of random numbers N1, N2 ranging between zero and one;
    computing the first phase t1 as Tb·N1 and the second phase t2 as Tb·N2 on the basis of the first pair of random numbers in such a way that the phases are different from one another, Tb representing a base period.

3. The method according to claim 2, further comprising the following steps:

detecting the frequency f° of the clock associated to a microcontroller of the driving device (13); and computing the base period Tb as 1/f°.

4. The method according to claim 1, wherein said maximum threshold value θmax is 33 dBμV for an interval of interest ranging from 150 kHz to 120 MHz.

5. The method according to claim 1, wherein said maximum threshold value θmax is 20 dBμV for an interval of interest ranging from 150 kHz to 6 GHz.

6. A motor-vehicle lighting device, comprising:

a first set (3-A) of LEDs (5) that form a first branch (7-A) of a circuit provided with at least one first electronic switch (11-A) that can be activated by being closed to power the LEDs of the first branch (7-A);

a second set of LEDs (3-B) that form a second branch (7-B) of a circuit provided with at least one second electronic switch (11-B) that can be activated by being closed to power the LEDs of the second branch (7-B);

a third set of LEDs (3-C) that form a third branch (7-C) of a circuit provided with at least one third electronic switch (11-C) that can be activated by being closed to power the LEDs of the third branch (7-C); and a driving device (13) designed to supply to each first, second, and third electronic switch a respective first, second, and third driving signal having a rectangular waveform, a constant frequency, and a duration that can be adjusted according to a PWM control in order to control the current supplied to each set of LEDs and the brightness of the LEDs themselves, the second driving signal being spaced apart from the first driving signal by a time phase t1, and the third driving signal being spaced apart from the second driving signal by a time phase t2, said device being characterized in that the driving device (13) is configured for generating the phases t1 and t2 different from one another obtained according to the following operations:

defining limits in frequency of an interval of interest in which a radiated or conducted electromagnetic disturbance produced by said lighting device must not exceed a maximum threshold value θmax;

supplying to each first, second, and third electronic switch a respective first, second, and third driving signal having a rectangular waveform, a constant frequency, and a duration that can be adjusted according to a PWM control in order to control the current supplied to each set of LEDs and the brightness of the LEDs themselves, the second driving signal being spaced apart from the first driving signal by the time phase t1, and the third driving signal being spaced apart from the second driving signal by the time phase t2;

comparing the measured or simulated waveform of the electromagnetic disturbance deriving from the phases t1 and t2 with the maximum threshold value within the interval of interest defined; and in the case where the waveform of the disturbance exceeds the threshold, recalculating two phases t1 and t2 once again different from one another; otherwise, selecting the last phases t1 and t2 calculated and using them in the PWM control.

7. The device according to claim 6, wherein the LEDs (5) are arranged in series with respect to one another along each branch (7-A, 7-B, 7-C).

8. The device according to claim 6, wherein a resistor (15) is set along each branch and has a value of resistance configured for limiting the current that flows within the diodes to a target value.

9. The device according to claim 6, wherein the switch is provided by a semiconductor switch that is driven into the closing condition when the driving signal has a first logic value (1) and remains open when the driving signal has a second logic value (0).

10. The device according to claim 6, wherein each branch is sized in such a way as to present the same impedance as the one presented by the other branches in such a way that each branch absorbs substantially the same current.

\* \* \* \* \*